United States Patent
Minoura

(10) Patent No.: US 8,937,337 B2
(45) Date of Patent: Jan. 20, 2015

(54) COMPOUND SEMICONDUCTOR DEVICE, METHOD OF MANUFACTURING THE SAME, POWER SUPPLY DEVICE AND HIGH-FREQUENCY AMPLIFIER

(75) Inventor: Yuichi Minoura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 13/152,421

(22) Filed: Jun. 3, 2011

(65) Prior Publication Data

US 2012/0049955 A1    Mar. 1, 2012

(30) Foreign Application Priority Data

Aug. 31, 2010  (JP) .................................. 2010-194850

(51) Int. Cl.
| | |
|---|---|
| *H01L 29/66* | (2006.01) |
| *H01L 29/778* | (2006.01) |
| *H01L 21/74* | (2006.01) |
| *H01L 29/06* | (2006.01) |
| H01L 29/20 | (2006.01) |

(52) U.S. Cl.
CPC .......... *H01L 29/7787* (2013.01); *H01L 21/743* (2013.01); *H01L 29/0623* (2013.01); *H01L 29/0661* (2013.01); *H01L 29/66462* (2013.01); H01L 29/2003 (2013.01)
USPC ........... 257/194; 257/192; 257/213; 257/488; 257/621; 257/E29.246

(58) Field of Classification Search
USPC ............... 257/20–24, 27, 187–201, 213, 488, 257/621, E29.281, E29.246–E29.253, 257/E21.403–E21.407
See application file for complete search history.

(56) References Cited

U.S. PATENT DOCUMENTS

| | | | | |
|---|---|---|---|---|
| 5,236,854 | A  * | 8/1993 | Higaki | .......................... 438/167 |
| 6,311,046 | B1 * | 10/2001 | Dent | ............................... 455/91 |
| 6,555,851 | B2 | 4/2003 | Morizuka | |
| 7,333,564 | B2 * | 2/2008 | Sugiyama et al. | ............ 375/297 |
| 7,508,014 | B2 | 3/2009 | Tanimoto | |
| 7,683,399 | B2 | 3/2010 | Ishida | |
| 2007/0230222 | A1* | 10/2007 | Drabing et al. | ............ 363/21.01 |
| 2008/0067562 | A1* | 3/2008 | Kawasaki | ...................... 257/289 |
| 2009/0140262 | A1* | 6/2009 | Ohki et al. | ....................... 257/76 |
| 2011/0057235 | A1* | 3/2011 | Shim | ............................. 257/194 |

FOREIGN PATENT DOCUMENTS

| | | |
|---|---|---|
| JP | 04-225534 A | 8/1992 |
| JP | 2000-114275 A | 4/2000 |

(Continued)

OTHER PUBLICATIONS

Office Action of Japanese Patent Application No. 2010-194850 dated Jul. 22, 2014 with Partial Translation.

*Primary Examiner* — David Vu
*Assistant Examiner* — Cuong B Nguyen
(74) *Attorney, Agent, or Firm* — Kratz, Quintos & Hanson, LLP

(57) ABSTRACT

A compound semiconductor device includes a substrate having an opening formed from the rear side thereof; a compound semiconductor layer disposed over the surface of the substrate; a local p-type region in the compound semiconductor layer, partially exposed at the end of the substrate opening; and a rear electrode made of a conductive material, disposed in the substrate opening so as to be connected to the local p-type region.

7 Claims, 24 Drawing Sheets

(56) References Cited

FOREIGN PATENT DOCUMENTS

| JP | 2001-168111 | A1 | 6/2001 |
| JP | 2001-284576 | A1 | 10/2001 |
| JP | 2002-334890 | A | 11/2002 |
| JP | 2006-173582 | A1 | 6/2006 |
| JP | 2007-329205 | A1 | 12/2007 |

\* cited by examiner

US 8,937,337 B2

COMPOUND SEMICONDUCTOR DEVICE, METHOD OF MANUFACTURING THE SAME, POWER SUPPLY DEVICE AND HIGH-FREQUENCY AMPLIFIER

CROSS-REFERENCE TO RELATED APPLICATIONS

This application is based upon and claims the benefit of priority of the prior Japanese Patent Application No. 2010-194850, filed on Aug. 31, 2010, the entire contents of which are incorporated herein by reference.

FIELD

The present invention generally relates to a compound semiconductor device, a method of manufacturing the same, a power supply device and a high-frequency amplifier.

BACKGROUND

Many field-effect transistors (FETs), particularly high electron mobility transistors (HEMTs), have been reported as compound semiconductor devices. In particular, an AlGaN/GaN HEMT, including a GaN electron transit layer and an AlGaN electron supply layer, has been receiving attention lately. In an AlGaN/GaN HEMT, distortion occurs in the AlGaN layer due to the difference in lattice constant between GaN and AlGaN. This causes piezoelectric polarization, and a high-concentration two-dimensional electron gas (2DEG) is produced by the piezoelectric polarization and AlGaN spontaneous polarization.

In HEMTs, if holes generated by impact ionization in a high-electric field are accumulated in the electron transit layer, some problems occur. For example, the withstand voltage of the device may be reduced, or the Kink effect may occur, thereby varying the threshold voltage of the gate or vary the drain current. It is known that these problems can be effectively solved by extracting (discharging) the holes generated by impact ionization from the electron transit layer.

For example, in Japanese Unexamined Patent Application Publication Nos. 2001-284576, 2007-329205, 2006-173582, and 2001-168111, an electrode is provided on the surface or rear side of the electron transit layer to extract the holes from the electron transit layer.

The holes generated by impact ionization can easily transfer to the rear side of the electron transit layer due to the inclination of the vertical valence band in the device. Accordingly, it is expected that the holes can be effectively extracted by providing a hole extraction electrode on the rear side of the electron transit layer.

However, in the structure in which a hole extraction electrode is disposed directly on the rear surface of the electron transit layer, it is difficult to reliably extract holes. A hole extraction electrode may be provided on the rear surface of a p-type GaN layer formed under the electron transit layer. In this instance, however, the entire rear surface of the p-type GaN layer is covered with an electrically conductive layer. Consequently, a capacitance is generated between the upper side and the lower side of the HEMT and the high-frequency performance of the HEMT is degraded. Also, since a high electric field is applied between the drain electrode and the hole extraction electrode, the withstand voltage can be reduced.

SUMMARY

According to an aspect of the invention, a compound semiconductor device includes a substrate having an opening formed from the rear side thereof; a compound semiconductor layer disposed over the surface of the substrate; a local p-type region in the compound semiconductor layer, partially exposed at the end of the opening; and a rear electrode made of a conductive material, disposed in the opening so as to be connected to the local p-type region.

According to another aspect of the invention, a method of manufacturing a compound semiconductor device, the method includes forming a compound semiconductor layer over the surface of a substrate; forming an opening from the rear side of the substrate to expose a portion of the compound semiconductor layer; forming a local p-type region partially exposed at the end of the opening by introducing a p-type dopant to the portion of the compound semiconductor layer; and forming a rear electrode of a conductive material so as to be disposed in the opening and connected to the p-type region.

According to another aspect of the invention, a power supply device includes a high-voltage circuit including a transistor; a low-voltage circuit; and a transformer between the high-voltage circuit and the low-voltage circuit, wherein the transistor includes a substrate having an opening formed from the rear side thereof, a compound semiconductor layer disposed over the surface of the substrate and having a local p-type region therein partially exposed at the end of the opening, and a rear electrode made of a conductive material, disposed in the opening so as to be connected to the p-type region.

According to another aspect of the invention, a high-frequency amplifier that amplifies a high-frequency input voltage, the high-frequency amplifier includes a transistor including a substrate having an opening formed from the rear side thereof, a compound semiconductor layer disposed over the surface of the substrate and having a local p-type region therein partially exposed at the end of the opening, and a rear electrode made of a conductive material, disposed in the opening so as to be connected to the p-type region.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
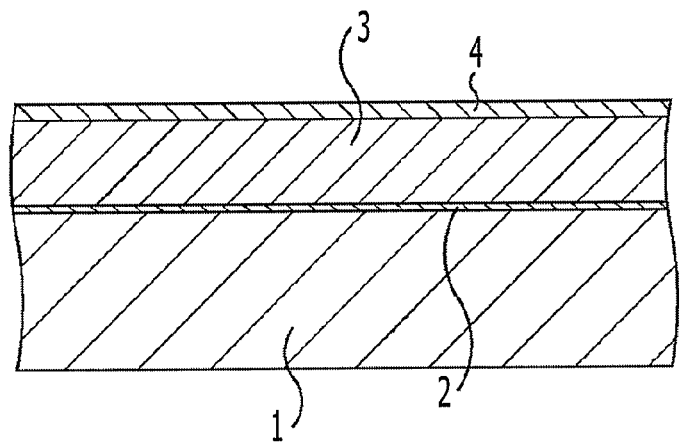
FIGS. 1A to 1I are schematic sectional views illustrating a method of manufacturing an AlGaN/GaN HEMT according to a first embodiment.

Embodiments of the invention will now be described in reference to the drawings. The following descriptions describe embodiments that disclose AlGaN/GaN HEMTs as a type of compound semiconductor device, and describe their structures and manufacturing methods. For the sake of convenience for illustration, the components or members illustrated in the drawings may not be illustrated in correct proportions.

First Embodiment

FIGS. 1A to 1I illustrate a method of manufacturing an AlGaN/GaN HEMT according to a first embodiment. FIGS. 2A to 2C illustrate specific steps in the method of manufacturing the AlGaN/GaN HEMT of the first embodiment.

A substrate 1 is prepared for growth. An insulating or a semi-insulating substrate is used as the substrate 1. For example, a semi-insulating SiC substrate, a semi-insulating GaN substrate, a semi-insulating Si substrate, or an insulating sapphire substrate is preferred. In the present embodiment, a semi-insulating SiC substrate is used.

Figure 2A:
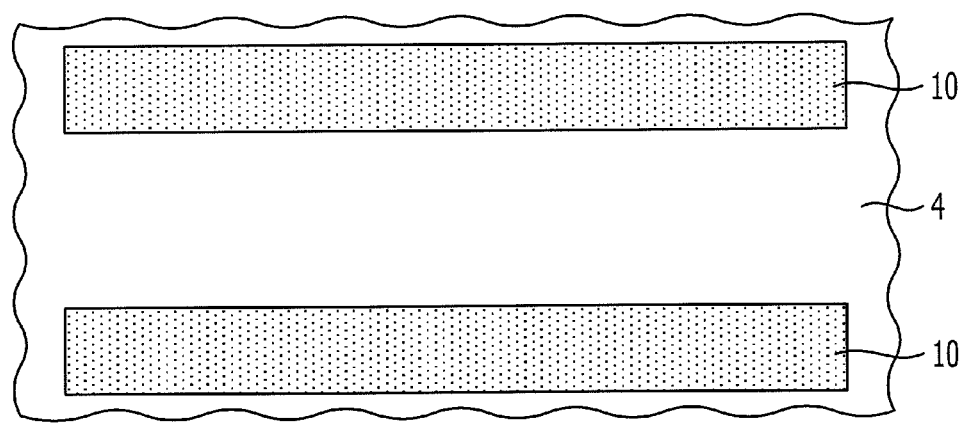
FIGS. 2A to 2C are schematic plan views illustrating specific steps in the method of manufacturing the AlGaN/GaN HEMT of the first embodiment.
Figure 2B:
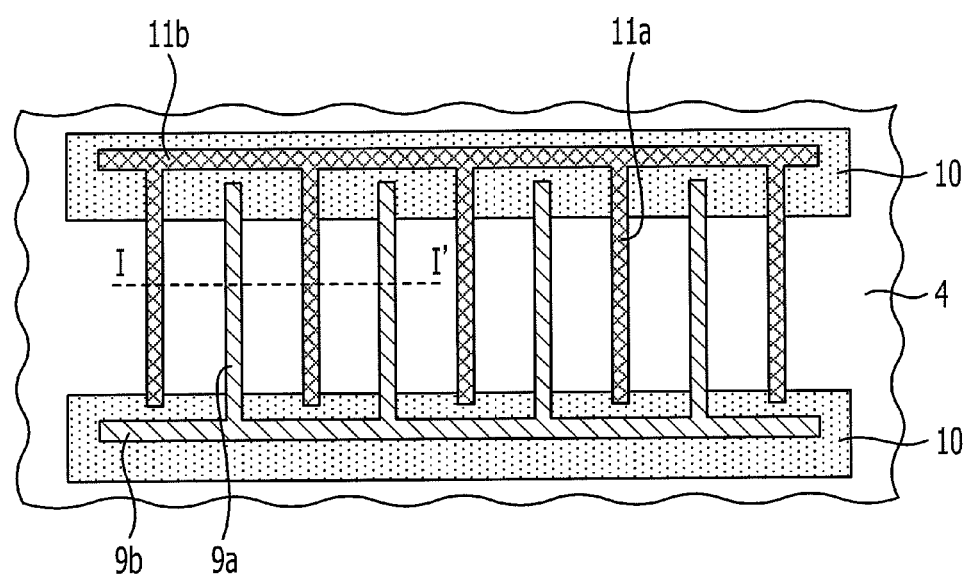
Figure 2C:
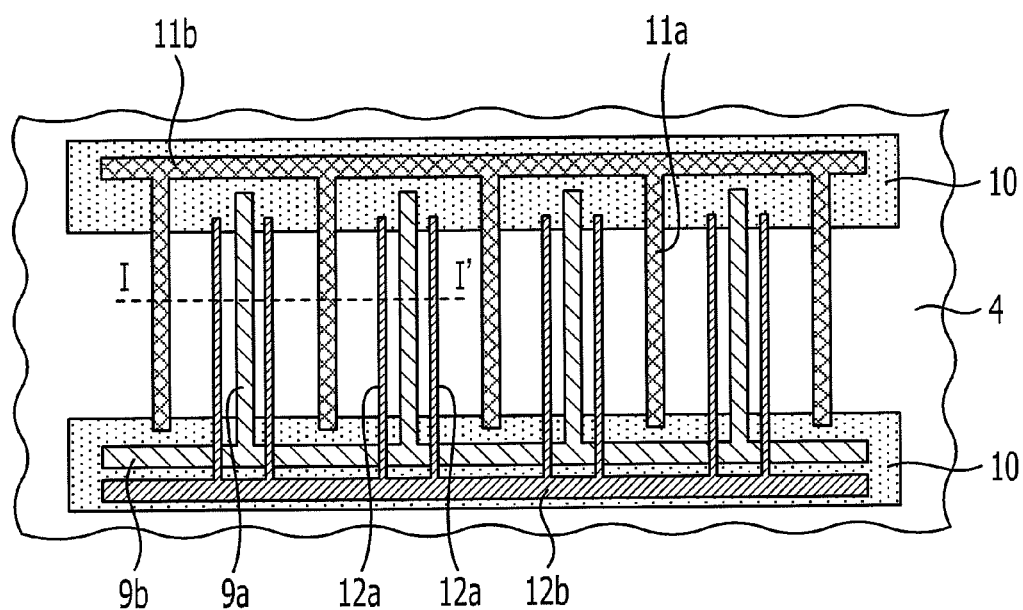

As illustrated in FIG. 1A, a buffer layer 2, an electron transit layer 3, and an electron supply layer 4 are formed over the substrate 1.

These layers may be formed by growing compound semiconductors over the substrate 1 by, for example, a molecular beam epitaxy (MBE) method. As an alternative to the MBE method, a metal organic chemical vapor deposition (MOCVD) method may be used.

By depositing AlN, i-GaN, and n-AlGaN over the SiC substrate 1, the buffer layer 2, the electron transit layer 3 and the electron supply layer 4 are formed. The buffer layer 2 is formed to a thickness of about 20 nm, and the electron transit layer 3 is formed to a thickness of about 2 μm. The electron supply layer 4 is formed to a thickness of about 20 nm at an Al ratio of 0.2. An intermediate layer may be provided between the electron transit layer 3 and the electron supply layer 4 by growing i-AlGaN. It may be preferable that a cap layer be formed over the electron supply layer 4 by, for example, growing n+—GaN.

For the growth of AlN, i-GaN and n-AlGaN, a mixture of trimethyl aluminum gas, trimethyl gallium gas and ammonia gas may be used as the source gas. According to the growing compound semiconductor layers, the presence or absence and the flow rates of the trimethyl aluminum gas (Al source) and trimethyl gallium gas (Ga source) are appropriately adjusted. The flow rate of the common source gas or ammonia gas is set to about 100 ccm to 10 LM. The growth pressure is set to about 50 to 300 Torr, and the growth temperature is set to about 1000 to 1200° C. When n-AlGaN is grown, AlGaN is doped with Si by adding a Si-containing gas, such as $SiH_4$ gas, as an n-type dopant to the source gas at a predetermined flow rate. The doping concentration of Si is about $1\times10^{18}$ cm$^{-3}$ to $1\times10^{20}$ cm$^{-3}$, such as about $5\times10^{18}$ cm$^{-3}$.

Figure 1B:
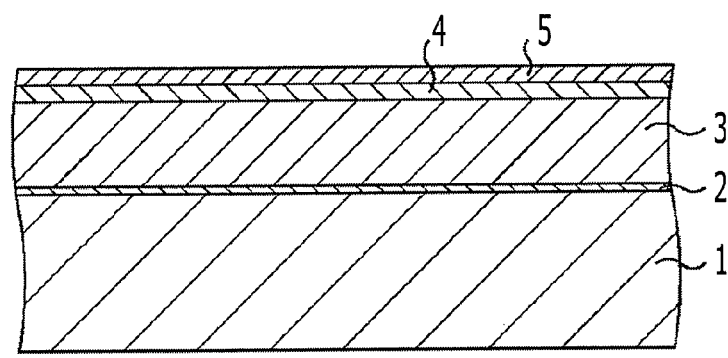

As illustrated in FIG. 1B, a protective film 5 is formed over the electron supply layer 4.

For example, $SiO_2$ is deposited to a thickness of about 200 nm over the electron supply layer 4 by chemical vapor deposition (CVD), thereby forming the protective film 5. The protective layer 5 protects the surface of the substrate 1 when the rear side of the substrate 1 is worked on. Preferably, the protective layer 5 is formed of a material resistant to heat applied for heat treatment of the rear side of the substrate, and less reactive with GaN and AlGaN. For example, $SiO_2$ is preferred. Depending on the operating temperature, the protective film 5 may be formed of SiN, AlN or the like.

Figure 1C:
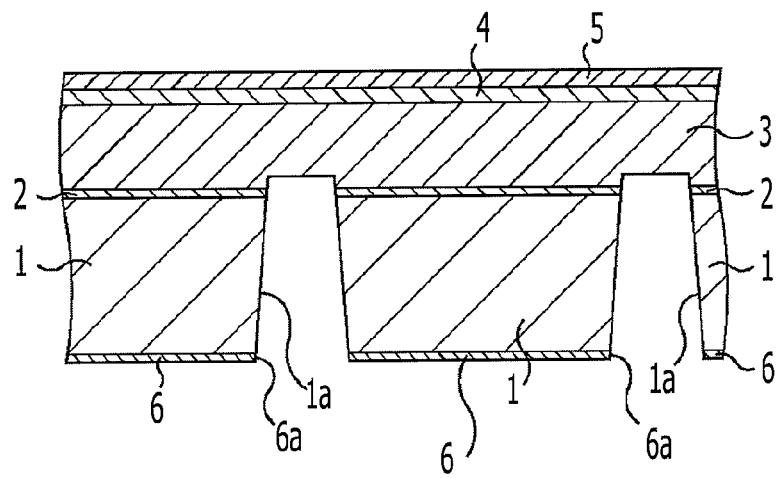

As illustrated in FIG. 1C, openings 1a are formed in the substrate 1 from the rear side.

For example, Ni is deposited over the rear surface of the substrate 1 by sputtering or the like. The Ni layer is worked into an etching mask 6 by lithography and dry etching. The etching mask 6 has openings 6a through which the regions of the rear surface of the substrate 1 over which source electrodes are to be formed over the electron supply layer 4 in a subsequent step are exposed.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3, because the buffer layer 2 is much thinner than the electron transit layer 3, and because SiC and GaN have high etching selectivity. The end point of the etching may be detected by monitoring the wavelength of Ga plasma emitted from the etched GaN electron transit layer 3 during etching. If part of the buffer layer 2 or a low-quality material remains over the rear surface of the electron transit layer 3, it is removed using, for example, a KOH solution of about 70 to 80° C.

Thus the openings 1a are formed in the substrate 1, corresponding to the openings 6a of the etching mask 6, so that the rear surface of the electron transit layer 3 is exposed in the regions over which the source electrodes are to be formed.

Figure 1D:
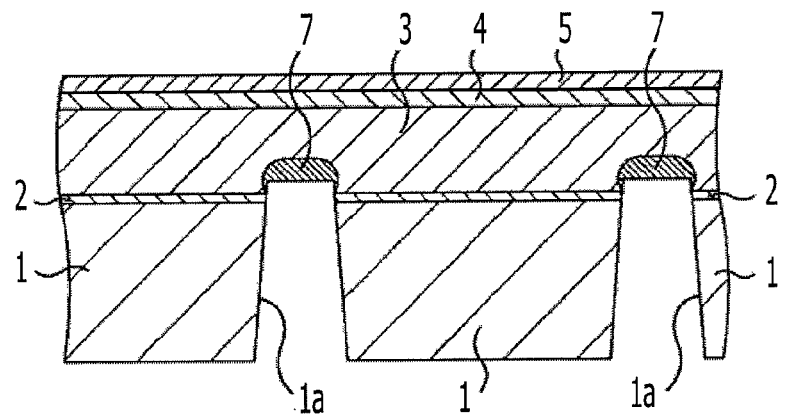

As illustrated in FIG. 1D, p-type regions 7 are formed in the portions of the electron transit layer 3 exposed at the ends of the openings 1a.

For example, a p-type dopant, such as beryllium ions ($Be^+$), is implanted into the exposed portions of the electron transit layer 3 to a depth of about 200 nm, using the etching mask 6 as an ion implantation mask. As an alternative to Be⁺, magnesium ions (Mg⁺) may be used as the p-type dopant.

After the ion implantation, the substrate 1 is annealed at, for example, about 900° C. for 30 about minutes in a nitrogen atmosphere to cause the p-type dopant to diffuse in the electron transit layer 3. Thus, p-type regions 7 are locally formed in the portions of the electron transit layer 3 exposed at the ends of the openings 1a.

The remaining etch masking 6 is removed by wet etching.

Figure 1E:
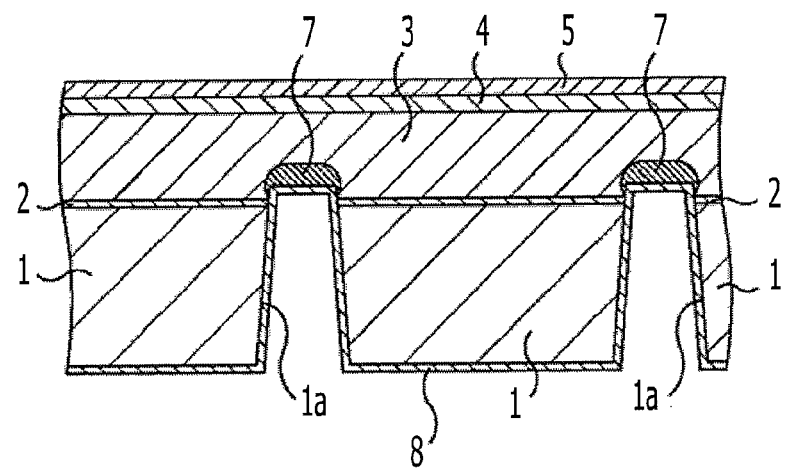

As illustrated in FIG. 1E, a rear electrode 8 is formed over the rear surface of the substrate 1.

For example, a conductive material is deposited over the rear surface of the substrate 1 including the inner walls (side surfaces and ends) of the openings 1a. In the present embodiment, for example, Ni and Au are deposited to thicknesses of about 10 nm and about 200 nm, respectively. Thus, the rear electrode 8 in ohmic contact with the p-type regions 7 is formed over the entire surface of the substrate 1 including the inner walls of the openings 1a. The rear electrode 8 is to be appropriately connected to the source electrodes (source lines) to be formed in a subsequent step through contact holes or the like or with wires. Alternatively, the rear electrode 8 may be connected to gate electrodes (gate line) instead of the source electrodes.

Figure 1F:
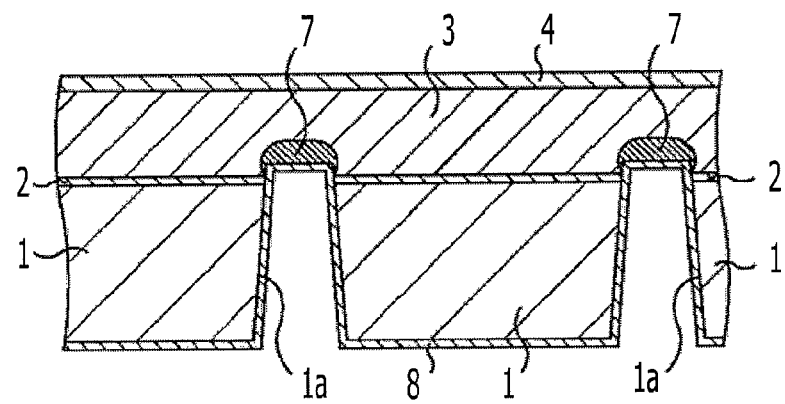

As illustrated in FIG. 1F, the protective film 5 used for protecting the surface of the substrate 1 in the steps illustrated in FIGS. 1C to 1E is removed.

For example, the surface of the substrate 1 is subjected to wet etching with hydrofluoric acid or the like. The protective film 5 is thus removed.

Turning now to FIG. 2A, element isolation structures 10 are formed over the electron supply layer 4.

For example, a resist is applied over the surface of the electron supply layer 4, and the layer of the resist is subjected to lithography. Thus a resist mask having openings is formed. The openings expose the portions of the electron supply layer 4 where element isolation regions are to be formed.

Subsequently, a dopant, such as boron (B) or argon (Ar) ions, is implanted into the exposed portions of the electron supply layer 4 through the resist mask. Thus the element isolation structures 10 are formed in electron isolation regions of the electron supply layer 4. The element isolation structures 10 may be formed by chlorine-based dry etching using a shallow trench isolation (STI) method, instead of ion implantation.

Figure 1G:
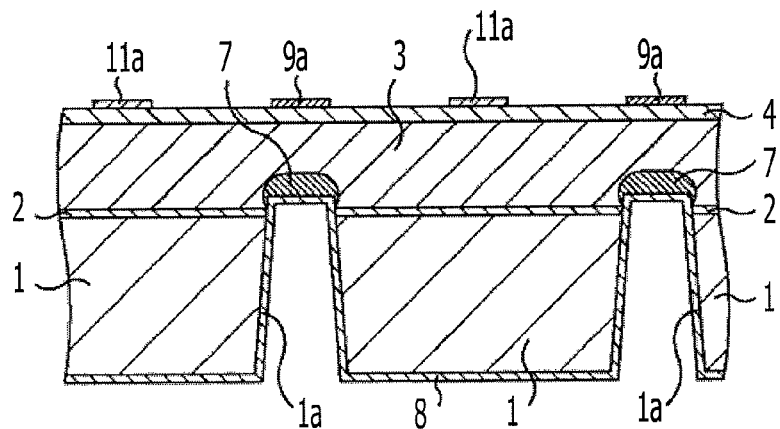

As illustrated in FIGS. 1G and 2B, source electrodes 9a, a source line 9b, drain electrodes 11a, and a drain line 11b are formed. FIG. 1G illustrates the section taken along dashed line I-I' in FIG. 2B.

For example, a resist is applied over the surface of the electron supply layer 4, and the layer of the resist is subjected to lithography. Thus a resist mask is formed which has openings in the regions where the source electrodes and source line and the drain electrodes and drain line are to be formed.

Subsequently, for example, Ti and Al are deposited as the electrode material over the resist mask to thicknesses of about 100 nm and about 30 nm so as to fill the openings by vapor deposition. The resist mask and the overlying layers of Ti and Al are removed by a lift-off method. Then, the substrate 1 is heat-treated at a temperature of about 400 to 1000° C., such as about 700° C., in, for example, a nitrogen atmosphere so that the remaining Ti and Al portions come into ohmic contact with the electron supply layer 4. Thus, the source electrodes 9a and source line 9b and the drain electrodes 11a and drain line 11b are formed over the electron supply layer 4. The source electrodes 9a and source line 9b, and the drain electrodes 11a and drain line 11b are integrated respectively, as illustrated in FIG. 2B. The source electrodes 9a and the drain electrodes 11a are disposed over the active regions of the electron supply layer 4 defined by the element isolation structures 10, and the source line 9b and the drain line 11b are disposed over the respective element isolation structures 10. The source electrodes 9a and the drain electrodes 11a are arranged along each other in a comb-like manner (in the form of fingers).

After the formation of the source electrodes 9a and source line 9b and the drain electrodes 11a and drain line 11b, an insulating film is formed to cover, for example, only the source line 9b.

For example, an insulating film is formed over the entire surface of the substrate 1 by depositing, for example, SiN by CVD. Then, the SiN insulating film is formed into a shape covering only the source line 9b by lithography and dry etching.

Figure 1H:
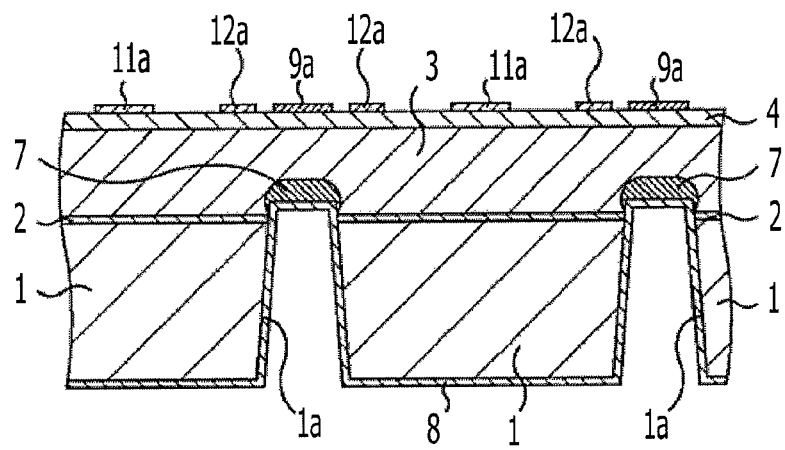

Subsequently, gate electrodes 12a and a gate line 12b are formed as illustrated in FIGS. 1H and 2C. FIG. 1H illustrates the section taken along dashed line I-I' in FIG. 2C.

For example, a resist is applied over the surface of the electron supply layer 4, and the layer of the resist is subjected to lithography. Thus a resist mask is formed which has openings in the regions where the gate electrodes and gate line are to be formed.

Subsequently, for example, Ni and Au are deposited as the electrode material over the resist mask to thicknesses of about 10 nm and about 200 nm so as to fill the openings by vapor deposition. The resist mask and the overlying layers of Ni and Au are removed by a lift-off method. Thus, the gate electrodes 12a and the gate line 12b are formed over the electron supply layer 4. The gate electrodes 12a and gate line 12b are integrated, and each pair of the gate electrodes 12a is disposed with the corresponding source electrode 9a therebetween along each other, as illustrated in FIG. 2C.

Figure 1I:
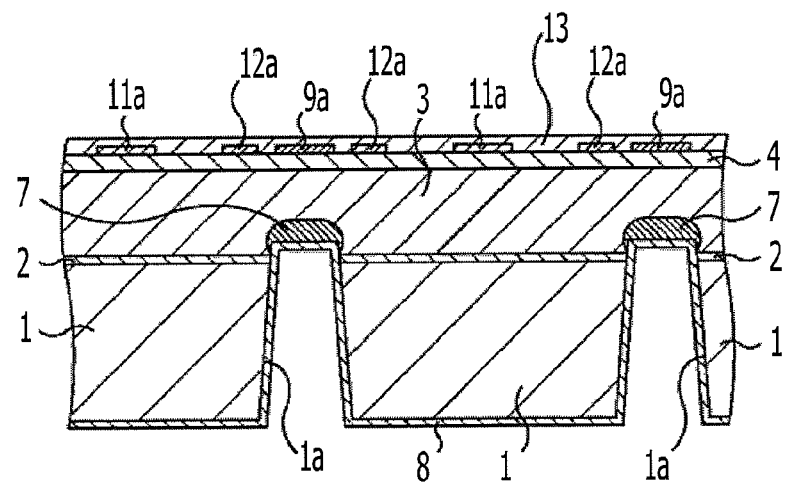

Subsequently, a passivation film 13 is formed as illustrated in FIG. 1I.

For example, an insulating film is formed over the entire surface of the electron supply layer 4. In the present embodiment, a SiN film is formed to a thickness of about 500 nm by CVD. Thus the passivation film 13 is formed.

Then, an insulating interlayer and wires electrically connected to the source electrodes 9a, drain electrodes 11a and gate electrodes 12a are formed; and thus, the AlGaN/GaN HEMT is completed.

The advantage of the AlGaN/GaN HEMT of the present embodiment will now be described (on the basis of the comparison with the effects of a comparative example).

Figure 3:
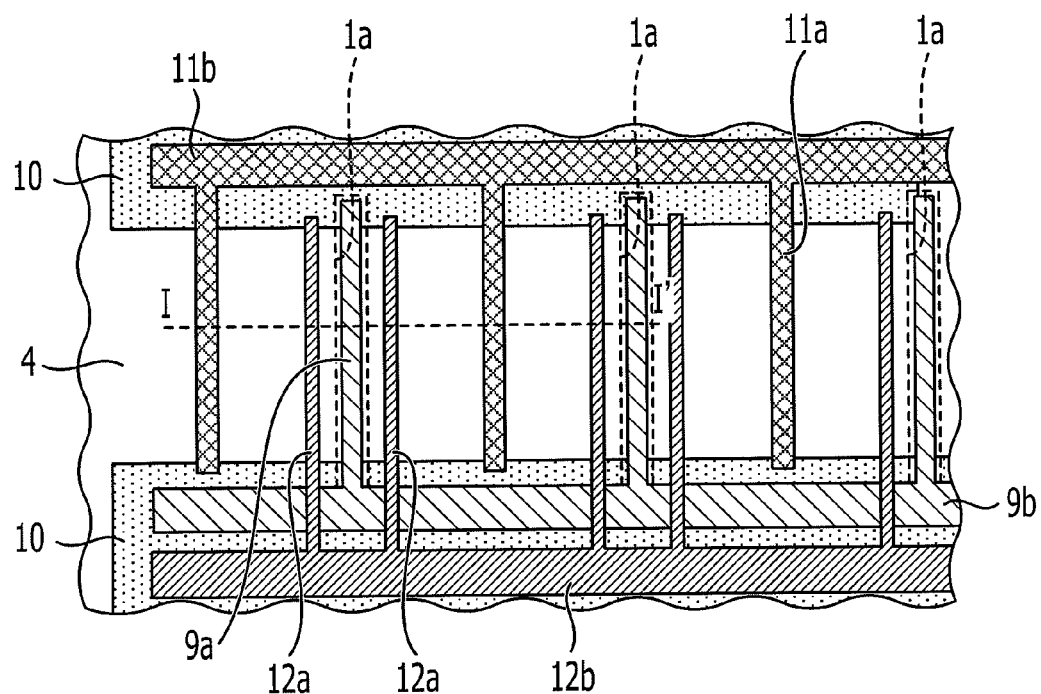
FIG. 3 is a schematic plan view illustrating the advantage of the AlGaN/GaN HEMT of the first embodiment.
Figure 4:
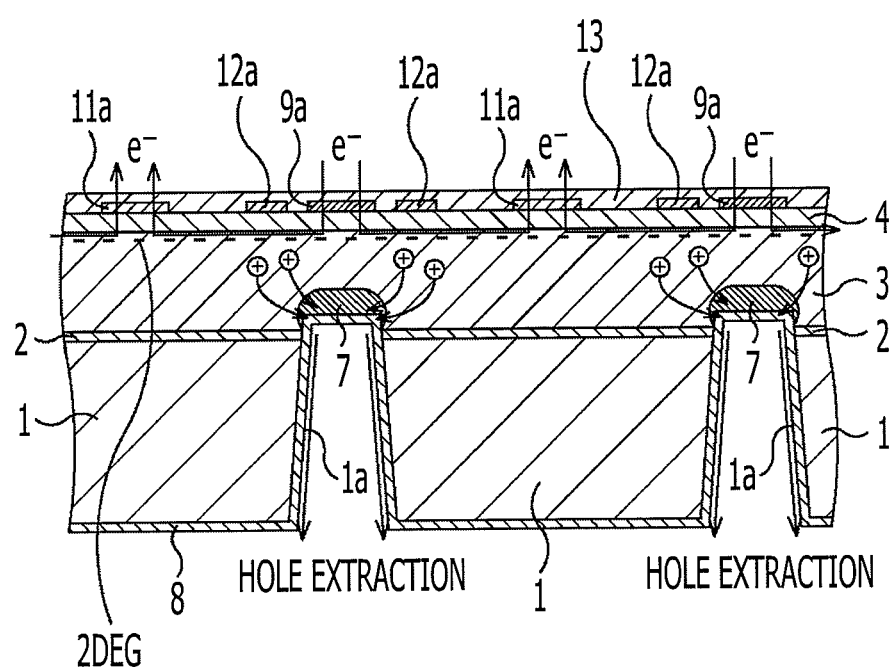
FIG. 4 is a schematic sectional view of the AlGaN/GaN HEMT taken along dashed line I-I' in FIG. 3, corresponding to FIG. 1I.
Figure 5:
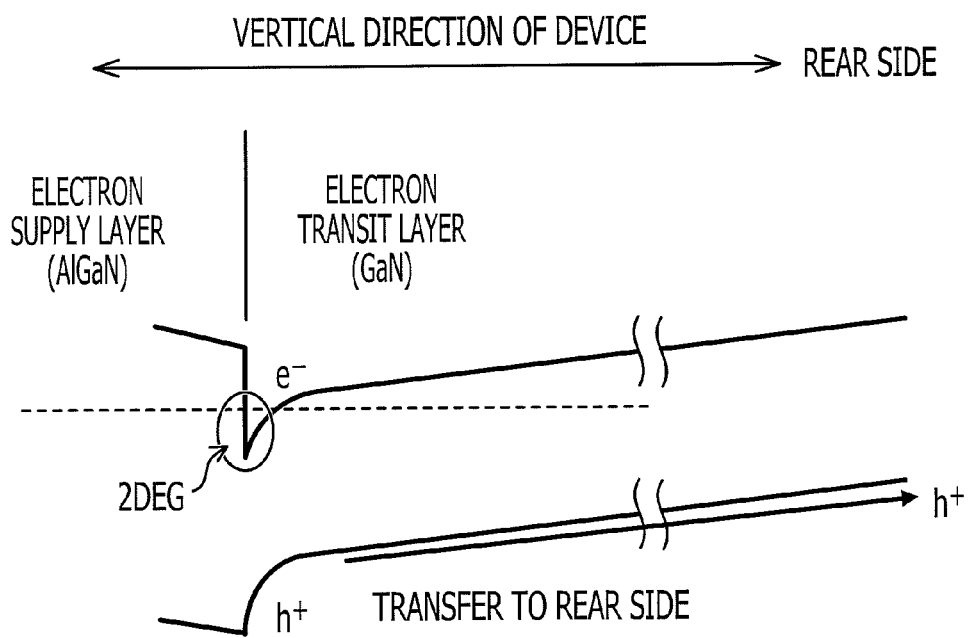
FIG. 5 is a representation of the energy band in the electron transit layer and the electron supply layer of the AlGaN/GaN HEMT of the first embodiment.

FIG. 3 (not illustrating the passivation layer 13) is a schematic plan view illustrating the advantage of the AlGaN/GaN HEMT of the first embodiment, corresponding to FIG. 2C. FIG. 4 is a schematic sectional view of the AlGaN/GaN HEMT taken along dashed line I-I' in FIG. 3, corresponding to FIG. 1I. FIG. 5 is a representation of the energy band in the electron transit layer 3 and the electron supply layer 4 of the AlGaN/GaN HEMT of the first embodiment.

As illustrated in FIG. 4, the AlGaN/GaN HEMT generates a two dimensional electron gas (2DEG) near the interface between the electron transit layer 3 and the electron supply layer 4. In the present embodiment, the openings 1s are formed from the rear side of the substrate 1 only under the source electrodes so as to be aligned with the source electrodes, as illustrated in FIGS. 3 and 4. The ends of the openings 1s lie under the source electrodes 9a, and the rear electrode 8 is in ohmic contact with the p-type regions 7 only at these portions. The rear electrode 8 is appropriately connected to the source electrodes 9a (and to the source line 9b) through contact holes.

In the AlGaN/GaN HEMT, holes generated in the 2DEG in the electron transit layer 3 migrate toward the rear side of the electron transit layer 3 due to the potential gradient, as illustrated in FIG. 5. At this time, the holes migrate to the p-type regions 7 in the rear side of the electron transit layer 3 under the source electrodes 9a. This is because, in the p-type semiconductor, holes are responsible for electric conduction. The holes in the p-type regions 7 are discharged through the rear electrode 8. The p-type regions 7 are locally formed in the electron transit layer 3 so as to be aligned with the ends of the openings 1a in the substrate 1. Thus, the p-type regions 7 are exposed only at the ends of the openings 1a when viewed from the rear side of the substrate 1. Accordingly, there are non-worked thick portions, which are not conductive or the p-type regions 7, between each region from the drain electrodes 11a to the gate electrode 12a and the rear electrode 8, in the substrate 1 other than the openings 1a. This structure allows the holes generated by impact ionization to be removed effectively without increasing the capacitance due to the presence of the conductive regions at the rear side of the substrate 1 or causing breakdown between the drain electrodes and the rear electrode.

As described above, the structure of the AlGaN/GaN HEMT of the present embodiment prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present embodiment can exhibit high withstand voltage and high reliability.

Some modifications of the first embodiment are described hereinafter. In the following modifications, the same parts as in the first embodiment are designated by the same reference numerals, and their detailed descriptions will be omitted.

[Modification 1]

Although the present modification discloses the same AlGaN/GaN HEMT as in the first embodiment, it is different in that the openings of the substrate 1 are formed in different regions.

Figure 6:
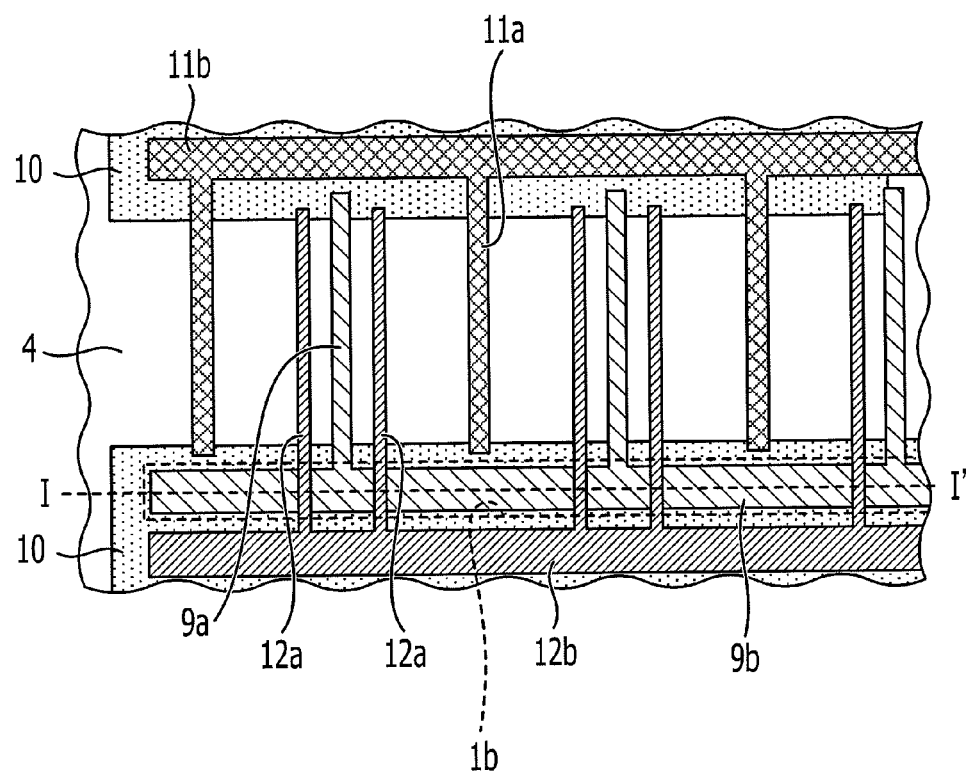
FIG. 6 is a schematic plan view of an AlGaN/GaN HEMT according to Modification 1 of the first embodiment.
Figure 7:
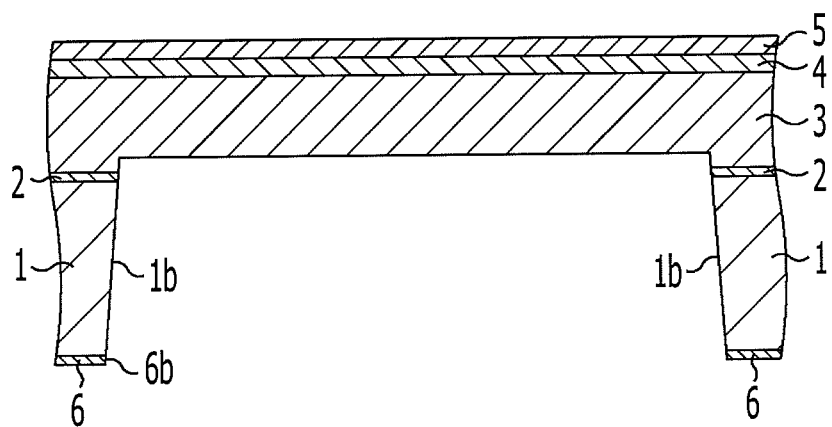
FIG. 7 is a schematic sectional view taken along dashed line I-I' in FIG. 6, illustrating a step corresponding to the step illustrated in FIG. 1C.

FIG. 6 is a schematic plan view of an AlGaN/GaN HEMT according to Modification 1 of the first embodiment. FIG. 7 is a schematic sectional view taken along dashed line I-I' in FIG. 6, which illustrate a step corresponding to the step illustrated in FIG. 1C of the first embodiment.

Although, in the present modification, the AlGaN/GaN HEMT is produced through substantially the same steps as in the first embodiment illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 7. The etching mask 6 has an opening 6b exposing the region of the rear surface of the substrate 1 over which the source line is to be formed over the electron supply layer 4 in a subsequent step.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3 because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the opening 1b is formed in the substrate 1, corresponding to the opening 6b of the etching mask 6, and exposes the region of the rear surface of the electron transit layer 3 over which the source line is to be formed.

In the AlGaN/GaN HEMT of the present modification, the opening 1b is formed only under the source line in the substrate 1 from the rear side, as illustrated in FIG. 6. The end of the opening 1b lies under the source line 9b, and the rear electrode 8 is in ohmic contact with the p-type region 7 only at this portion. The rear electrode 8 is appropriately connected to the source electrodes 9a (and to the source line 9b) through contact holes.

The structure of the AlGaN/GaN HEMT of the present modification prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since the opening 1b is formed from the rear side of the substrate 1 so as to be aligned with the source line 9b, the area of the opening 1b is increased. Consequently, the work of the rear side of the substrate 1, such as dry etching, can be easily performed.

[Modification 2]

Although the present modification discloses the same AlGaN/GaN HEMT as in the first embodiment, it is different in that the openings of the substrate 1 are formed in different regions.

Figure 8:
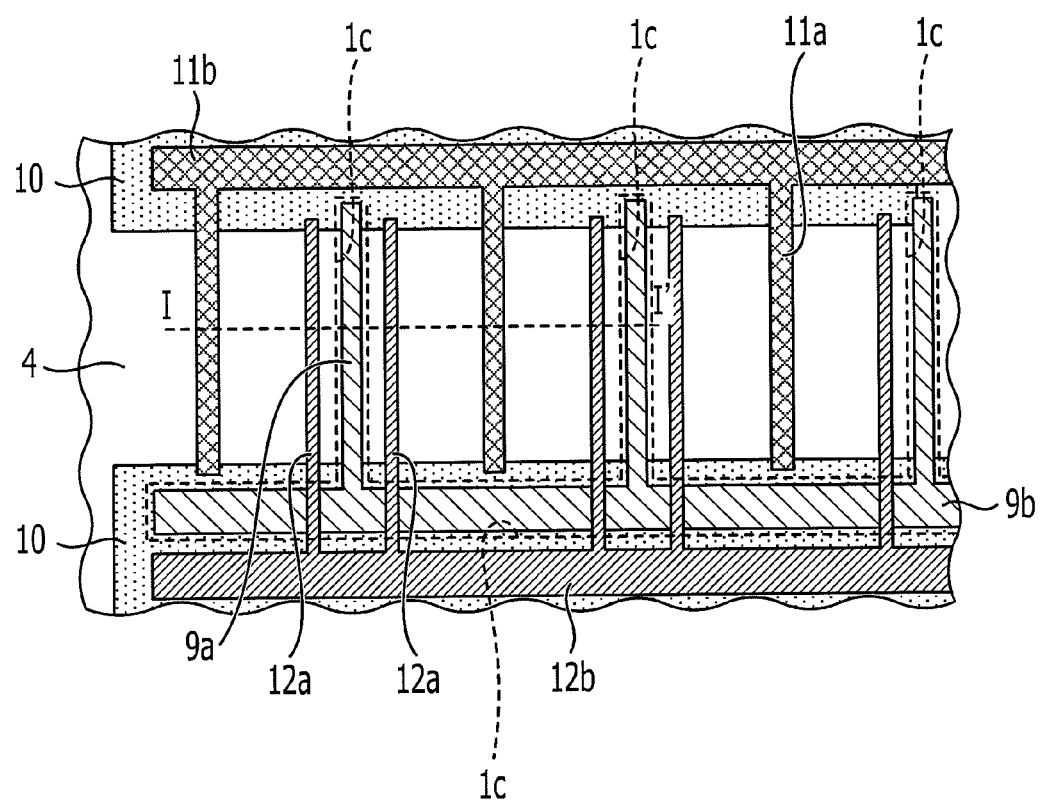
FIG. 8 is a schematic plan view of an AlGaN/GaN HEMT according to Modification 2 of the first embodiment.
Figure 9:
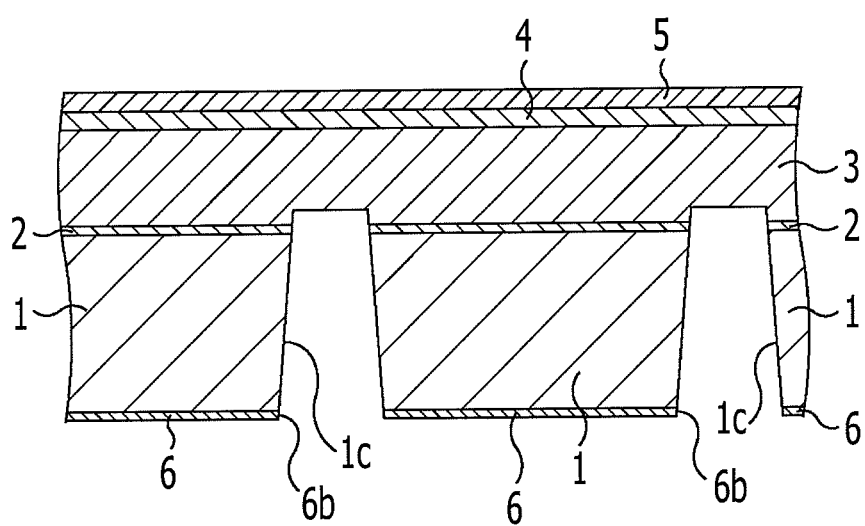
FIG. 9 is a schematic sectional view taken along dashed line I-I' in FIG. 8, illustrating a step corresponding to the step illustrated in FIG. 1C.

FIG. 8 is a schematic plan view of an AlGaN/GaN HEMT according to Modification 2 of the first embodiment. FIG. 9 is a schematic sectional view, taken along dashed line I-I' in FIG. 8, for illustrating a step corresponding to the step illustrated in FIG. 1C of the first embodiment.

Although, in the present modification, the AlGaN/GaN HEMT is produced through substantially the same steps as in the first embodiment illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 9. The etching mask 6 has an opening 6c exposing the region of the rear surface of the substrate 1 over which the source electrodes and source line are to be formed over the electron supply layer 4 in a subsequent step.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3, because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the opening is formed in the substrate 1, corresponding to the opening 6c of the etching mask 6, and exposes the region of the rear surface of the electron transit layer 3 over which the source electrodes and source line are to be formed.

In the AlGaN/GaN HEMT of the present modification, the opening 1c is formed only under the source electrodes 9a and the source line 9b in the substrate 1 from the rear side, as illustrated in FIG. 8. The end of the opening 1c lies under the source electrodes 9a and the source line 9b, and the rear electrode 8 is in ohmic contact with the p-type region 7 only at this portion. The rear electrode 8 is appropriately connected to the source electrodes 9a (and to the source line 9b) through contact holes.

The structure of the AlGaN/GaN HEMT of the present modification prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since, in the present modification, some portions of the opening 1c lie under the source electrodes 9a so as to be aligned with each other, holes can be highly efficiently extracted. Also, since the opening is formed from the rear side of the substrate 1 so as to be aligned with the source electrodes and source line 9a and 9b, the area of the opening 1c is increased. Consequently, the work of the rear side of the substrate 1, such as dry etching, can be easily performed.

[Modification 3]

Although the present modification discloses the same AlGaN/GaN HEMT as in the first embodiment, it is different in that the openings of the substrate 1 are formed in different regions.

Figure 10:
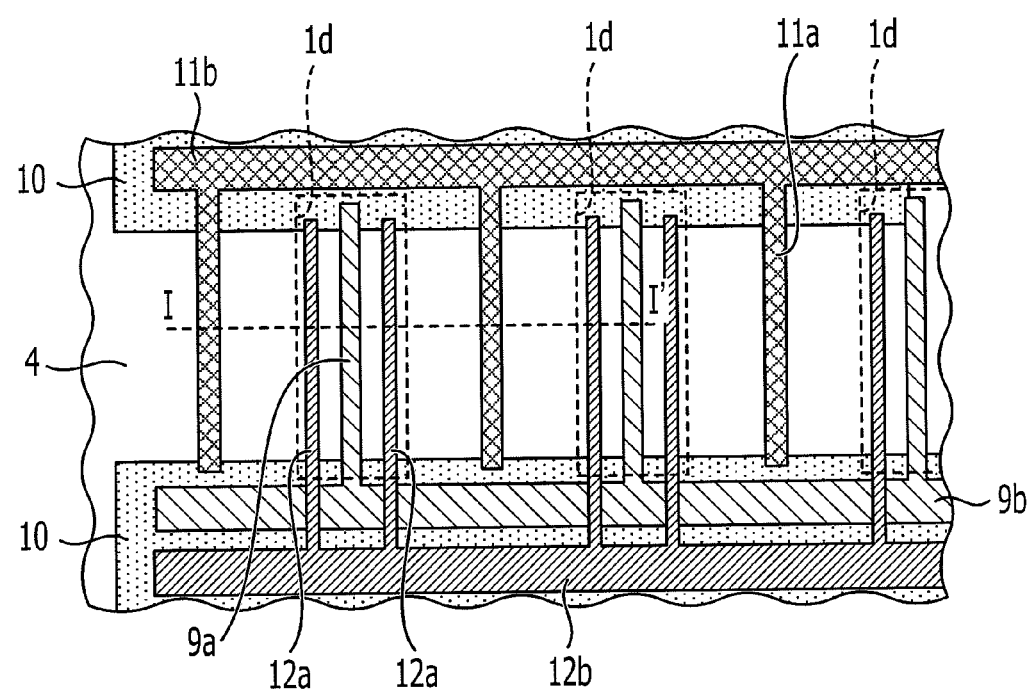
FIG. 10 is a schematic plan view of an AlGaN/GaN HEMT according to Modification 3 of the first embodiment.
Figure 11:
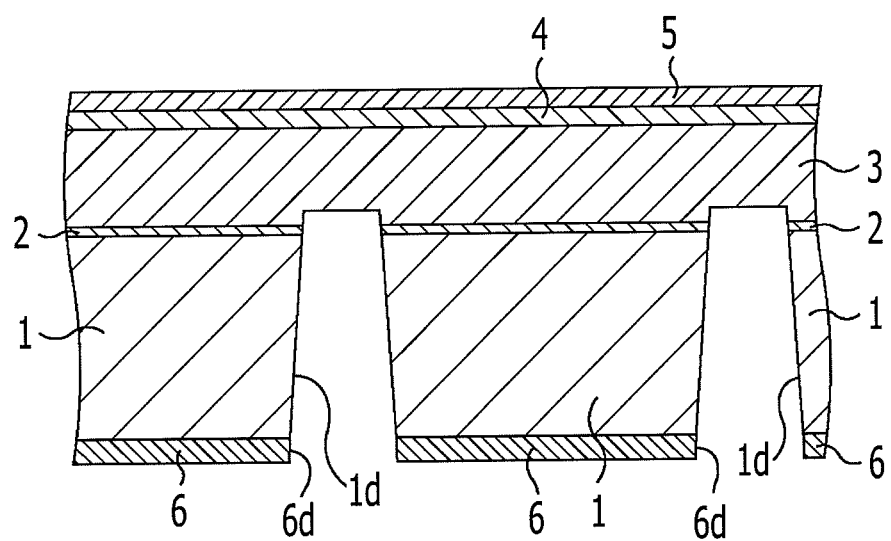
FIG. 11 is a schematic sectional view taken along dashed line I-I' in FIG. 10, illustrating a step corresponding to the step illustrated in FIG. 1C.

FIG. 10 is a schematic plan view of an AlGaN/GaN HEMT according to Modification 3 of the first embodiment. FIG. 11 is a schematic sectional view, taken along dashed line I-I' in FIG. 10, for illustrating a step corresponding to the step illustrated in FIG. 1C of the first embodiment.

Although, in the present modification, the AlGaN/GaN HEMT is produced through substantially the same steps as in the first embodiment illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching. The etching mask 6 has openings 6d for exposing each region of the rear surface of the substrate 1 over which the source electrode and the corresponding gate electrodes are to be formed over the electron supply layer 4 in a subsequent step, as illustrated in FIG. 11.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3, because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the openings 1d are formed in the substrate 1, corresponding to the openings 6d of the etching mask 6, and expose the regions of the rear surface of the electron transit layer 3 over which the source electrode and a pair of gate electrodes are to be formed in such a manner that the source electrode is disposed between the gate electrodes.

In the AlGaN/GaN HEMT of the present modification, the openings 1d are formed in the substrate 1 from the rear side, only under each region where the source electrode 9a is disposed between the gate electrodes 12a, as illustrated in FIG. 10. The ends of the openings 1d lie under each region where the source electrode 9a and the corresponding gate electrodes 12a are disposed, and the rear electrode 8 is in ohmic contact with the p-type regions 7 only at these portions. The rear electrode 8 is appropriately connected to the source electrodes 9a (and to the source line 9b) through contact holes.

The structure of the AlGaN/GaN HEMT of the present modification prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since, in the present modification, part of the openings 1d lie under the source electrodes 9a so as to be aligned with the source electrodes 9a, holes can be highly efficiently extracted. Also, since the openings 1d are formed from the rear side of the substrate 1 so as to be aligned with each region where the source electrode 9a is disposed between the corresponding gate electrodes 12a, the area of the openings 1d is increased. Consequently, the work of the rear side of the substrate 1, such as dry etching, can be easily performed.

[Modification 4]

Although the present modification discloses the same AlGaN/GaN HEMT as in the first embodiment, it is different in that the openings of the substrate 1 are formed in different regions.

Figure 12:
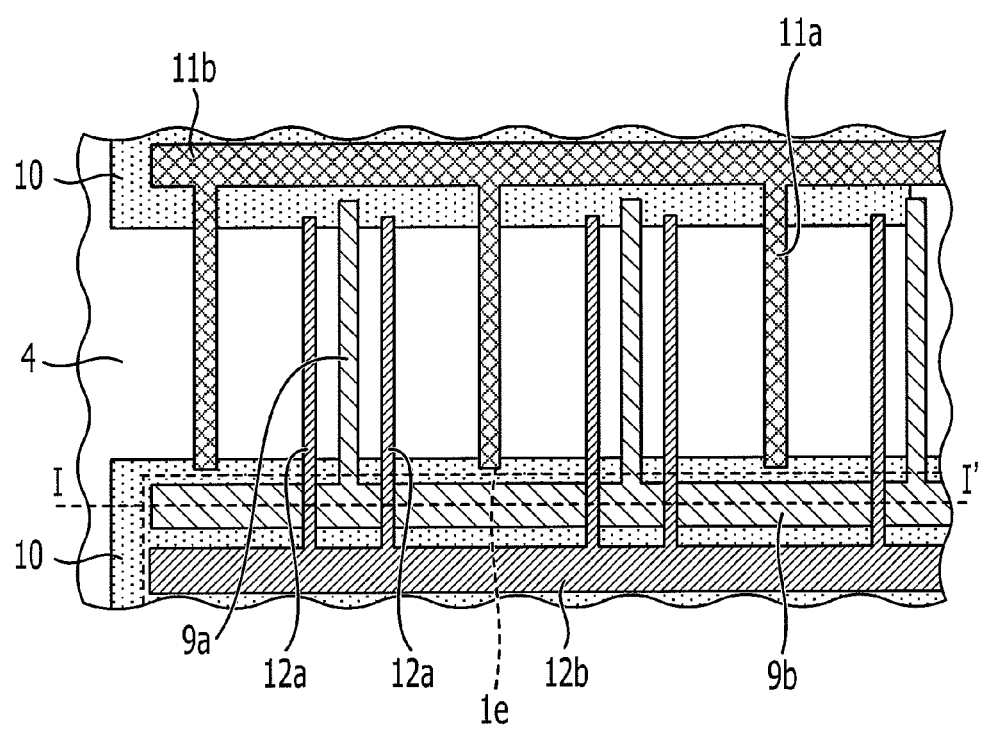
FIG. 12 is a schematic plan view of an AlGaN/GaN HEMT according to Modification 4 of the first embodiment.
Figure 13:
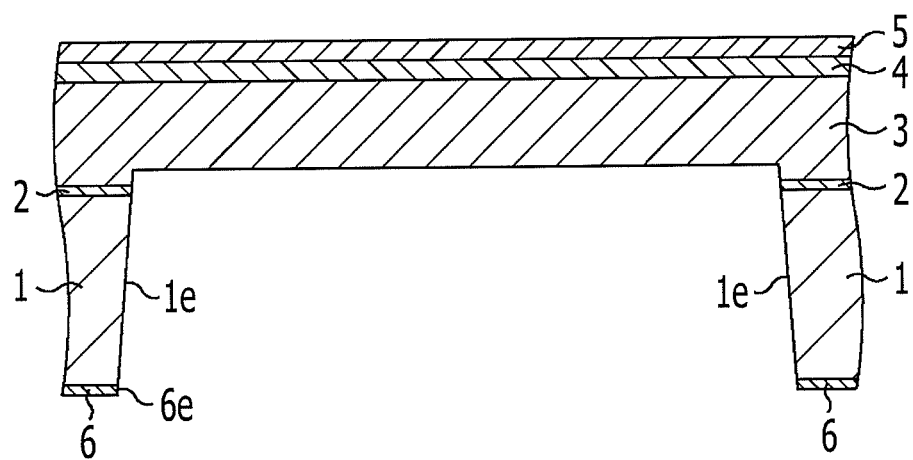
FIG. 13 is a schematic sectional view taken along dashed line I-I' in FIG. 12, illustrating a step corresponding to the step illustrated in FIG. 1C.

FIG. 12 is a schematic plan view of an AlGaN/GaN HEMT according to Modification 4 of the first embodiment. FIG. 13 is a schematic sectional view, taken along dashed line I-I' in FIG. 12, for illustrating a step corresponding to the step illustrated in FIG. 1C of the first embodiment.

Although, in the present modification, the AlGaN/GaN HEMT is produced through substantially the same steps as in the first embodiment illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 13. The etching mask 6 has an opening 6e for exposing the region of the rear surface of the substrate 1 over which the source line and the gate line are to be formed along each other over the electron supply layer 4 in a subsequent step.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3, because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the opening 1e is formed in the substrate 1, which corresponds to the opening 6e of the etching mask 6, and exposes the region of the rear surface of the electron transit layer 3 over which the source line and the gate line are to be formed.

In the AlGaN/GaN HEMT of the present modification, the opening 1e is formed in the substrate 1 from the rear side, only under the region where the source line 9b and the gate line 12b are disposed, as illustrated in FIG. 12. The end of the opening 1e lies under the region where the source line 9b and the gate line 12b are disposed; and the rear electrode 8 is in ohmic contact with the p-type region 7 only at this portion. The rear electrode 8 is appropriately connected to the source electrodes 9a (and to the source line 9b) through contact holes.

The structure of the AlGaN/GaN HEMT of the present modification prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since the opening 1e is formed from the rear side of the substrate 1 so as to be aligned with the region where the source line 9b and the gate line 12b are disposed, the area of the opening 1e is increased. Consequently, the work of the rear side of the substrate 1, such as dry etching, can be easily performed.

[Modification 5]

Although the present modification discloses the same AlGaN/GaN HEMT as in the first embodiment, it is different in that the openings of the substrate 1 are formed in different regions.

Figure 14:
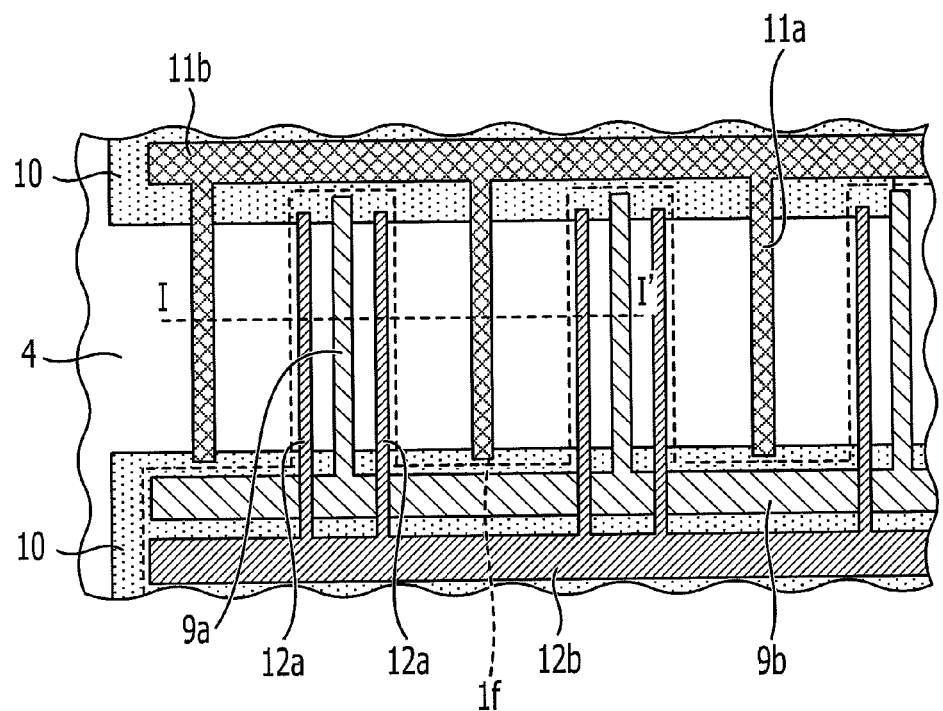
FIG. 14 is a schematic plan view of an AlGaN/GaN HEMT according to Modification 5 of the first embodiment.
Figure 15:
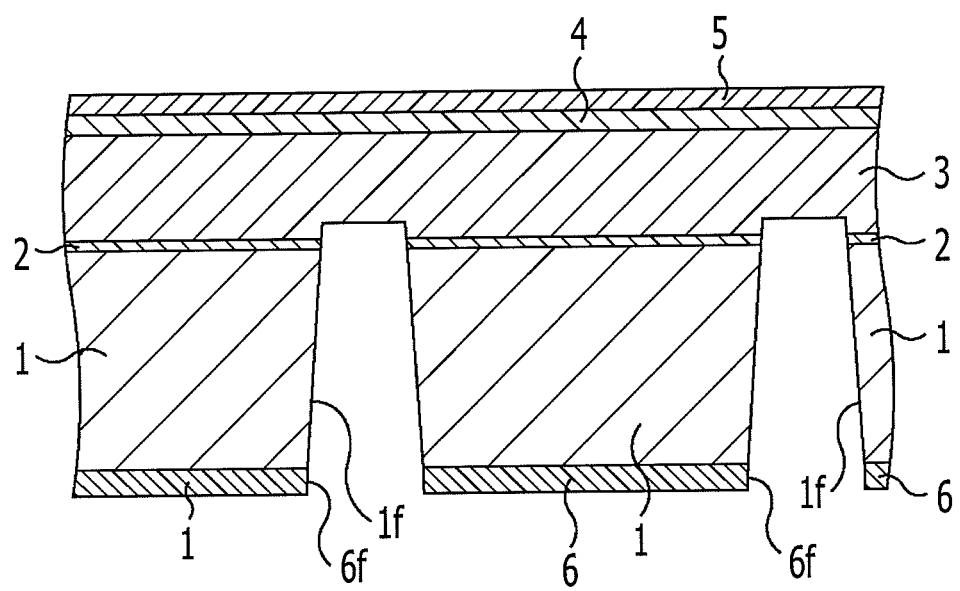
FIG. 15 is a schematic sectional view taken along dashed line I-I' in FIG. 14, illustrating a step corresponding to the step illustrated in FIG. 1C.

FIG. 14 is a schematic plan view of an AlGaN/GaN HEMT according to Modification 5 of the first embodiment. FIG. 15 is a schematic sectional view taken along dashed line I-I' in FIG. 14, illustrating a step corresponding to the step illustrated in FIG. 1C of the first embodiment.

Although, in the present modification, the AlGaN/GaN HEMT is produced through substantially the same steps as in the first embodiment as illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 15. The etching mask 6 has an opening 6f exposing a region of the rear surface of the substrate 1 corresponding to a specific portion over the electron supply layer 4 in a subsequent step. In this portion, the source electrodes and source line and the gate electrodes and gate line are to be formed in such a manner that the source electrodes are each disposed between the adjacent two gate electrodes with the source line extending along the gate line.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3 because the buffer layer 2 is much thinner than the electron transit layer 3, and because SiC and GaN have high etching selectivity. If part of the buffer layer 2 or a low-quality material remains on the rear surface of the electron transit layer 3, it is removed using, for example, a KOH solution of about 70 to 80° C.

Thus, the opening 1f is formed in the substrate 1, which corresponds to the opening 6f of the etching mask 6, and exposes the region of the rear surface of the electron transit layer 3 over which the source electrodes and source line and the gate electrodes and gate line are to be formed.

In the AlGaN/GaN HEMT of the present modification, the opening 1f is formed in the substrate 1 from the rear side, only under the region where the source electrodes 9a and source line 9b and the gate electrodes 12a and gate line 12b are disposed, as illustrated in FIG. 14. The end of the opening 1f lies under this region, and the rear electrode 8 is in ohmic contact with the p-type region 7 only at this portion. The rear electrode 8 is appropriately connected to the source electrodes 9a (and to the source line 9b) through contact holes.

The structure of the AlGaN/GaN HEMT of the present modification prevents the degradation of the high-frequency performance caused by the increase in capacitance, prevents the breakdown between the drain electrodes and drain line 11a and 11b and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since, in the present modification, the opening 1f lies partially under the source electrodes 9a so as to be aligned with the source electrodes, holes can be highly efficiently extracted. Also, since the opening 1f is formed from the rear side of the substrate 1 so as to be aligned with the region where the source electrodes and source line 9a and 9b and the gate electrodes 12a and gate line 12b are disposed, the area of the opening 1f is increased. Consequently, the work of the rear side of the substrate 1, such as dry etching, can be easily performed.

Second Embodiment

Although a second embodiment discloses an AlGaN/GaN HEMT similar to that of the first embodiment, the shapes of the gate electrodes, the source electrodes and the drain electrodes are different from those in the first embodiment. In the following embodiment, the same parts as in the first embodiment are designated by the same reference numerals, and their detailed description will be omitted.

Figure 16:
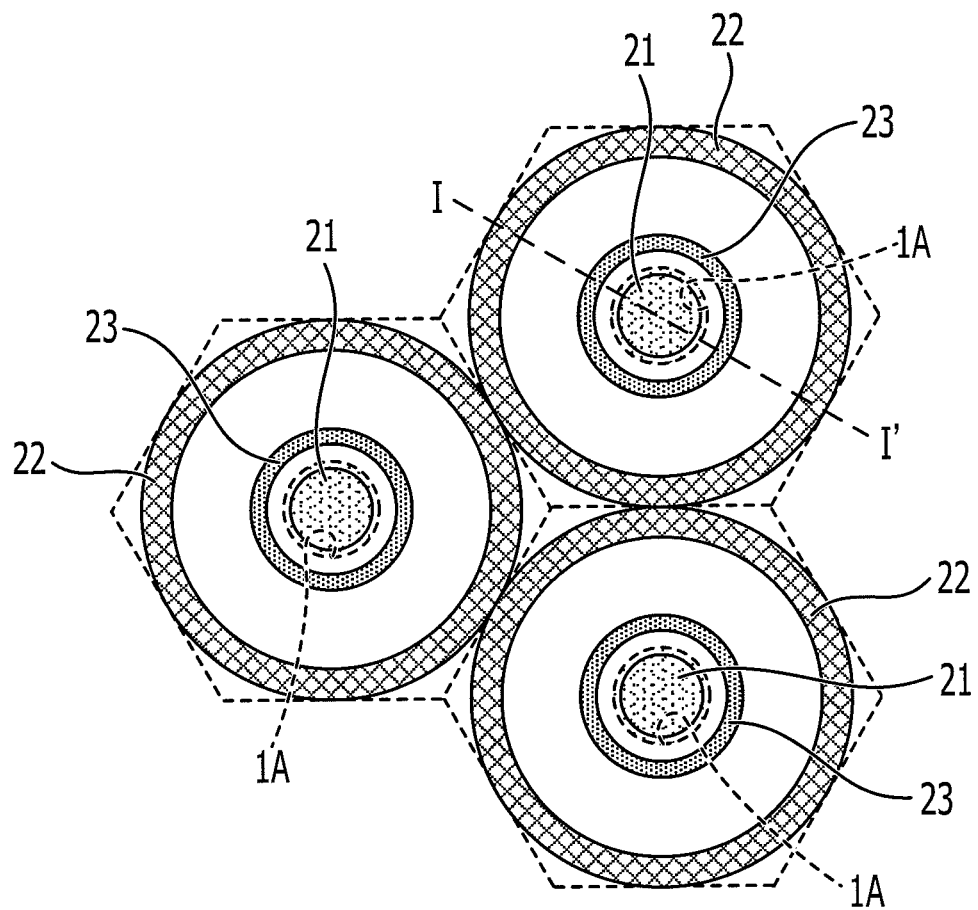
FIG. 16 is a schematic plan view of an AlGaN/GaN HEMT according to a second embodiment.
Figure 17A:
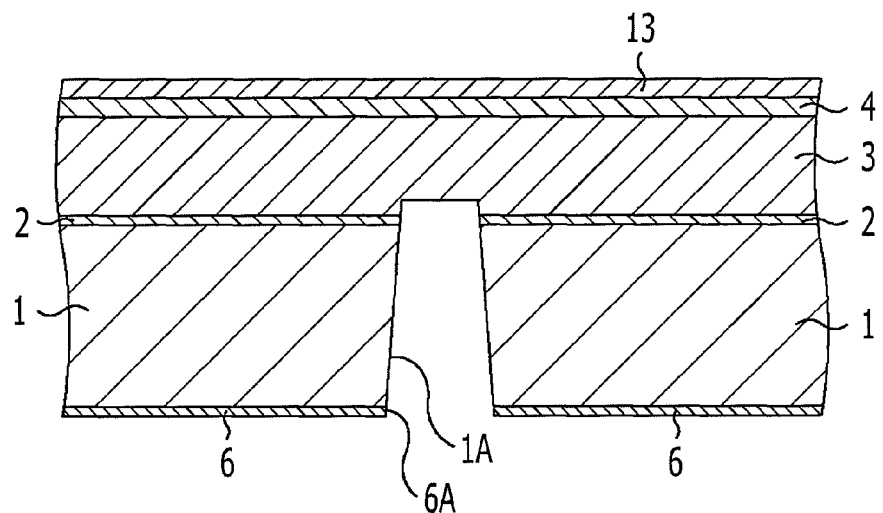
FIGS. 17A and 17B are schematic sectional views illustrating a method of manufacturing the AlGaN/GaN HEMT of the second embodiment.
Figure 17B:
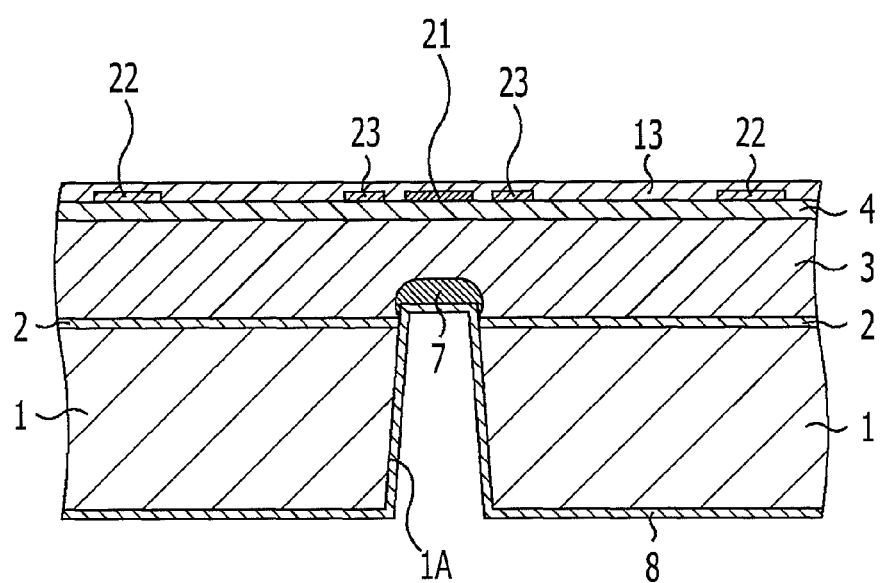

FIG. 16 is a schematic plan view of an AlGaN/GaN HEMT according to a second embodiment. FIGS. 17A and 17B are schematic sectional views illustrating a method of manufacturing the AlGaN/GaN HEMT of the second embodiment. FIG. 17A illustrates a step corresponding to the step of the first embodiment illustrated in FIG. 1C; and FIG. 17B illustrates a step corresponding to the step illustrated in FIG. 1I.

In the present embodiment, the AlGaN/GaN HEMT is manufactured through substantially the same steps as in the first embodiment as illustrated in FIGS. 1A to 1I and 2A to 2C. The gate electrodes, the source electrodes and the drain electrodes are formed in a comb-like manner in the first embodiment, whereas these electrodes are concentrically formed in the present embodiment.

As illustrated in FIG. 16, a source electrode 21 acting as a core, a ring-shaped gate electrode 23, and a ring-shaped drain electrode 22 are concentrically formed in that order, in each of a plurality of virtually honeycomb regions (hexagonally shaped regions) indicated by dashed lines on the electron supply layer 4. The source electrode 21, the drain electrode 22 and the gate electrode 23 in each honeycomb region are appropriately and respectively connected to the source electrodes 21, the drain electrodes 22 and the gate electrodes 23 in other honeycomb regions through via holes or the like over the electron supply layer 4.

In the present embodiment, the step corresponding to the step of the first embodiment as illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 17A. The etching mask 6 has openings 6A exposing the regions of the rear surface of the substrate 1 over which source electrodes are to be formed over the electron supply layer 4 in a subsequent step.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3 because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the openings 1A are formed in the substrate 1, the openings 1A corresponding to the openings 6A of the etching mask 6, and expose the regions of the rear surface of the electron transit layer 3 over which the source electrodes are to be formed.

As illustrated in FIG. 17B, the AlGaN/GaN HEMT generates two dimensional electron gas (2DEG) near the interface between the electron transit layer 3 and the electron supply layer 4. In the present embodiment, the openings 1A are formed only under the source electrodes 21 in the substrate 1 from the rear side, as illustrated in FIGS. 16 and 17B. The ends of the openings 1a lie under the source electrodes 21; and the rear electrode 8 is in ohmic contact with the p-type regions 7 only at these portions. The rear electrode 8 is appropriately connected to the source electrodes 21 through contact holes.

The structure of the AlGaN/GaN HEMT of the present embodiment prevents the degradation of the high-frequency performance caused by the increase in capacitance, prevents the breakdown between the drain electrodes 22 and the rear electrode 8, and allows holes generated by impact ionization to be easily and reliably extracted and discharged without increasing the chip area. Thus, the AlGaN/GaN HEMT of the present modification can exhibit high withstand voltage and high reliability.

[Modification]

A modification of the second embodiment is hereinafter described. The modification discloses the same AlGaN/GaN HEMT as in the second embodiment except that the openings in the substrate 1 are formed in different regions.

Figure 18:
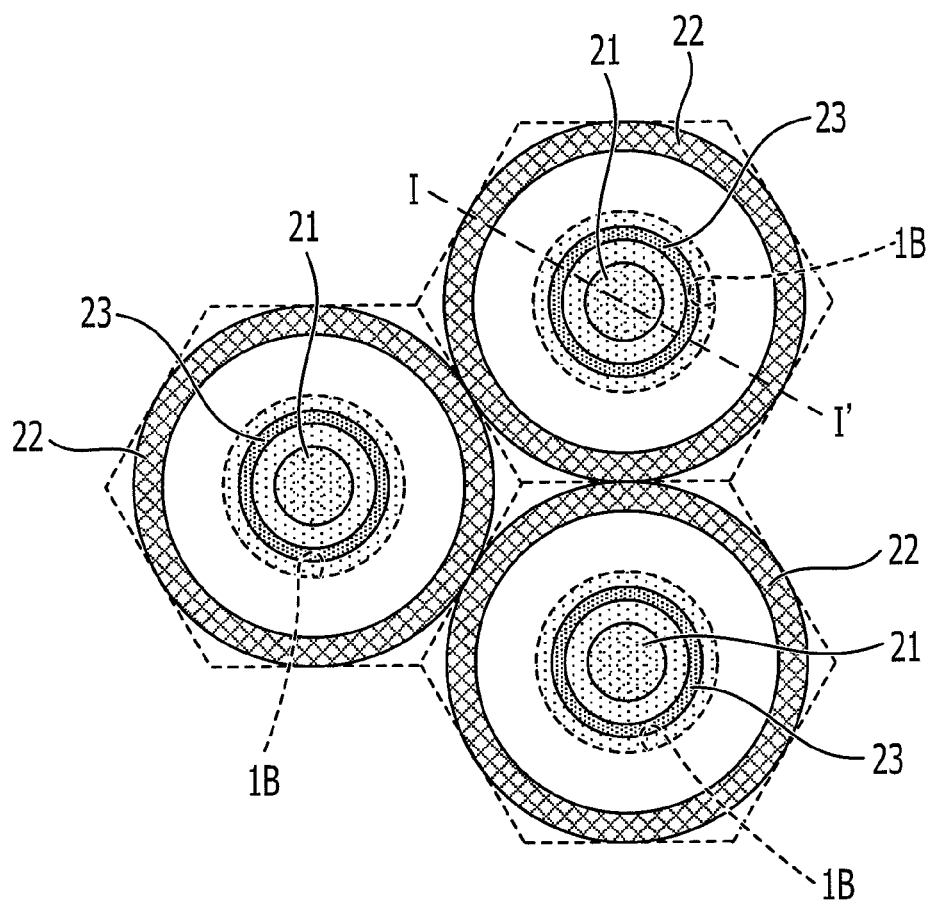
FIG. 18 is a schematic plan view of an AlGaN/GaN HEMT according to a modification of the second embodiment.
Figure 19A:
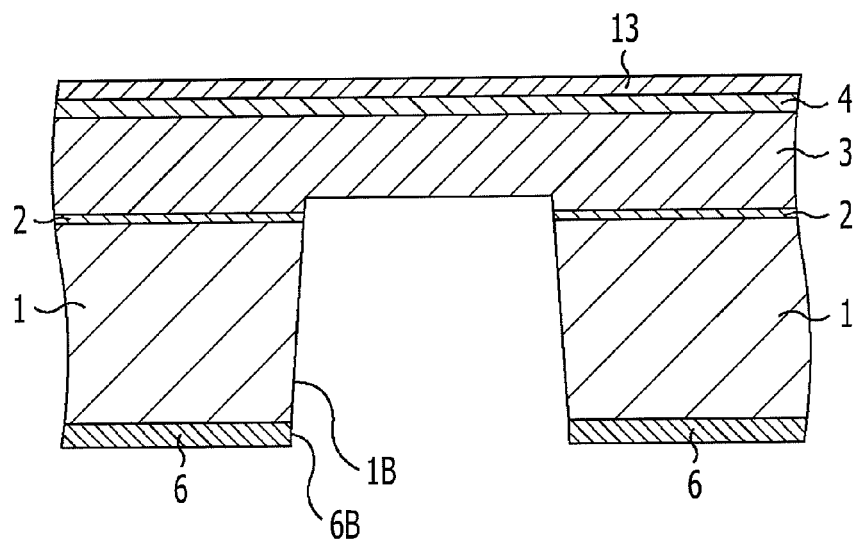
FIGS. 19A and 19B are schematic sectional views taken along dashed line I-I' in FIG. 18.
Figure 19B:
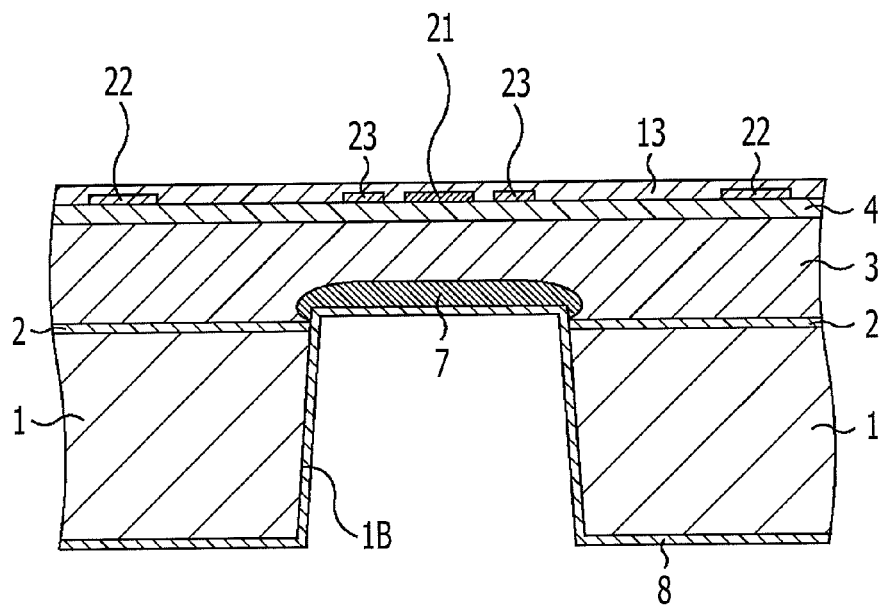

FIG. 18 is a schematic plan view of an AlGaN/GaN HEMT according to a modification of the second embodiment. FIGS. 19A and 19B are schematic sectional views, taken along dashed line I-I' in FIG. 18. FIG. 19A, which illustrate a step corresponding to the step illustrated in FIG. 1C of the first embodiment; and FIG. 19B illustrates a step as corresponding to the step illustrated in FIG. 1I of the first embodiment.

Although, in the present modification, the AlGaN/GaN HEMT is produced through substantially the same steps as in the first embodiment as illustrated in FIGS. 1A to 1I and 2A to 2C, the step corresponding to the step illustrated in FIG. 1C is performed as described below.

First, for example, Ni is deposited over the rear surface of the substrate 1 by sputtering or the like. The Ni layer is worked into an etching mask 6 by lithography and dry etching, as illustrated in FIG. 19A. The etching mask 6 has openings 6B exposing each region of the rear surface of the substrate 1 over which the source electrode and gate electrode are to be formed over the electron supply layer 4 in a subsequent step.

Subsequently, the rear side of the substrate 1 is subjected to dry etching through the etching mask 6. For example, a mixture of $SF_6$ gas and $O_2$ gas is used as the etching gas. If this mixed gas is used, etching is stopped at the time when it has reached the electron transit layer 3 because the buffer layer 2 is much thinner than the electron transit layer 3, and because SiC and GaN have high etching selectivity. If part of the buffer layer 2 or a low-quality material remains over the rear surface of the electron transit layer 3, it is removed using, for example, a KOH solution of about 70 to 80° C.

Thus, the openings 1B are formed in the substrate 1, which correspond to the openings 6B of the etching mask 6, and expose the regions of the rear surface of the electron transit layer 3 over which the source electrode and gate electrode are to be formed.

In the AlGaN/GaN HEMT of the present modification, the openings 1B are formed in the substrate 1 from the rear side, only under the regions where the source electrodes 21 and the gate electrodes 23 are disposed, as illustrated in FIG. 18. The ends of the openings 1B lie under each region where the source electrode 21 and the gate electrode 23 are disposed; and the rear electrode 8 is in ohmic contact with the p-type regions 7 only at these portions. The rear electrode 8 is appropriately connected to the source electrodes 21 through contact holes.

The structure of the AlGaN/GaN HEMT of the present modification prevents the degradation of the high-frequency performance caused by the increase in capacitance, prevents the breakdown between the drain electrodes 22 and the rear electrode 8, and allows holes generated by impact ionization to be easily and reliably extracted and discharged without increasing the chip area. Thus, the AlGaN/GaN HEMT of the present modification can exhibit high withstand voltage and high reliability. In addition, since, in the present modification, part of the openings 1B lie under the source electrodes 21 so as to be aligned with the source electrodes 21, holes can be highly efficiently extracted. Also, since the openings 1B are formed from the rear side of the substrate 1 so as to be aligned with each region where the source electrode 21 and the gate electrode 23 are disposed, the area of the openings 1B is increased. Consequently, the work of the rear side of the substrate 1, such as dry etching, can be easily performed.

Although the above first and second embodiments and their modifications have described AlGaN/GaN HEMTs as a type of compound semiconductor device, the invention is not limited to those AlGaN/GaN HEMTs, and may be applied to other HEMTs. For example, the following applications may be provided.

[Application 1]

An InAlN/AlN HEMT will be described as a compound semiconductor device.

InAlN and AlN are semiconductors, and AlN has a lower lattice constant than InAlN. In this instance, the electron transit layer 3 is formed of i-AlN and the electron supply layer 4 is formed of n-InAlN, for example, in the structure illustrated in FIG. 1A.

[Application 2]

An InAlGaN/AlN HEMT will be described as a compound semiconductor device.

InAlGaN and AlN are semiconductors, and AlN has a lower lattice constant than InAlGaN. In this instance, the electron transit layer 3 is formed of i-AlN and the electron supply layer 4 is formed of n-InAlGaN, for example, in the structure illustrated in FIG. 1A.

[Application 3]

An InAlGaN/InAlN HEMT will be described as a compound semiconductor device.

The lattice constants of InAlGaN and InAlN are varied depending on the relative proportions of In, Al and Ga. By controlling the relative proportions, InAlN may have a lower lattice constant than InAlGaN, or, in contrast, InAlGaN may have a lower lattice constant than InAlN. For example, when InAlGaN has a lower lattice constant than InAlN, the following described structure may be provided.

The electron transit layer 3 is formed of i-InAlN and the electron supply layer 4 is formed of n-InAlGaN, for example, in the structure illustrated in FIG. 1A.

[Application 4]

An $Al_{0.5}Ga_{0.5}N/Al_{0.3}Ga_{0.7}N$ HEMT will be described as a compound semiconductor device.

Even compound semiconductors containing the same elements may have different lattice constants if the proportions of the elements differ. For example, the lattice constant of AlGaN has different lattice constants between $Al_{0.3}Ga_{0.7}N$ and $Al_{0.5}Ga_{0.5}N$. The lattice constant of AlGaN decreases as the proportion of Al is increased. Accordingly, $Al_{0.5}Ga_{0.5}N$ has a lower lattice constant than $Al_{0.3}Ga_{0.7}N$.

In this instance, the electron transit layer 3 is formed of i-$Al_{0.3}Ga_{0.7}N$ and the electron supply layer 4 is formed of n-$Al_{0.5}Ga_{0.5}N$, for example, in the structure illustrated in FIG. 1A.

[Application 5]

An ZnMgO/ZnO HEMT will be described as a compound semiconductor device.

In this instance, the electron transit layer 3 is formed of i-ZnO and the electron supply layer 4 is formed of n-ZnMgO, for example, in the structure illustrated in FIG. 1A.

Third Embodiment

The present embodiment will disclose a power supply device including any one of the HEMTs disclosed in the first and second embodiments and their modifications.

Figure 20:
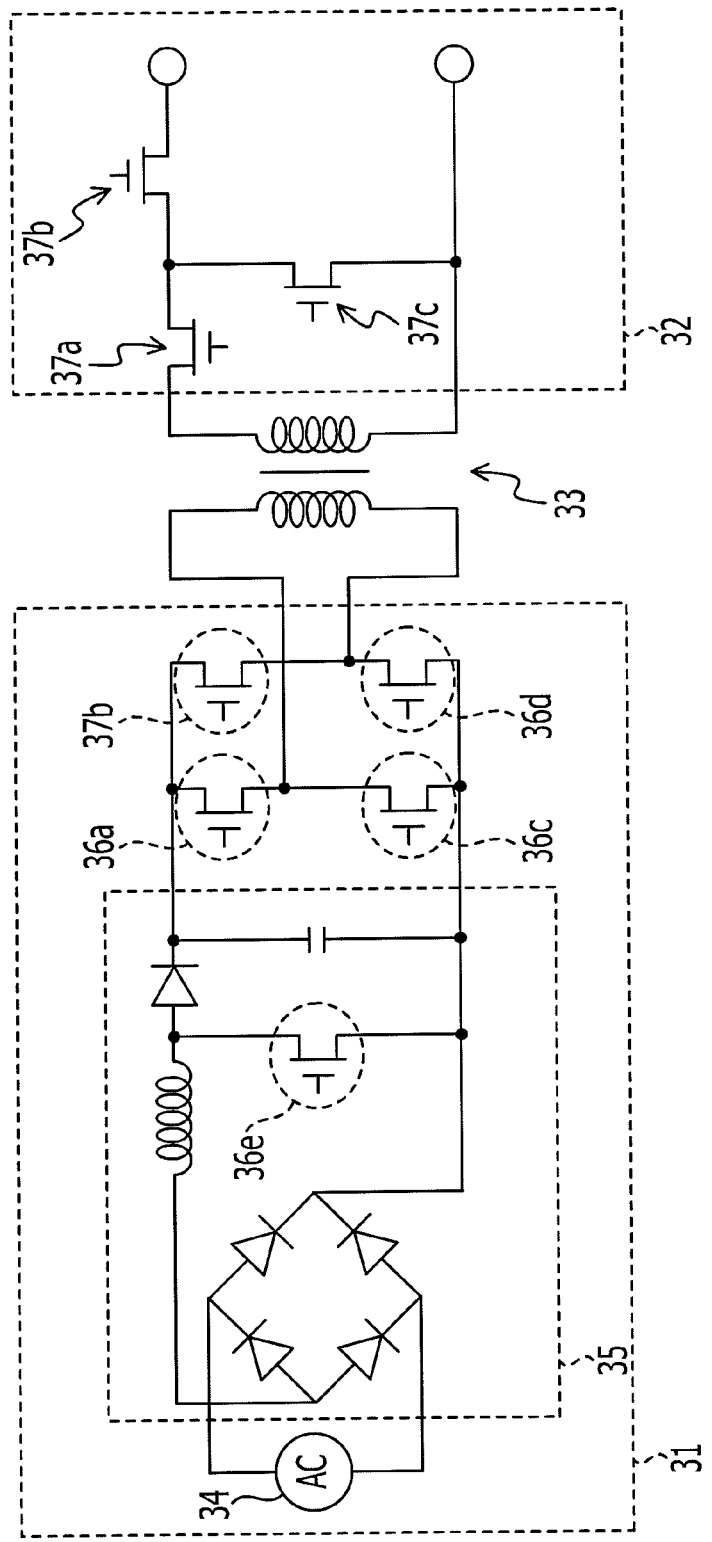
FIG. 20 is a schematic connection diagram of a power supply device according to a third embodiment.

FIG. 20 is a schematic connection diagram of a power supply device according to a third embodiment.

The power supply device of the present embodiment includes a high-voltage primary circuit 31, a low-voltage secondary circuit 32, and a transformer 33 disposed between the primary circuit 31 and the secondary circuit 32.

The primary circuit 31 includes an AC power source 34, a so-called bridge rectifier 35, and a plurality (four in the present embodiment) of switching elements 36a to 36d. The bridge rectifier 35 includes a switching element 36e.

The secondary circuit 32 includes a plurality (three in the present embodiment) of switching elements 37a to 37c.

In the present embodiment, HEMTs of any one of the first and second embodiments and their modifications are used as the switching elements 36a to 36e in the primary circuit 31. The switching elements 37a to 37c of the secondary circuit 32 are general silicon MIS FETs.

In the present embodiment, the high-voltage circuit includes the HEMTs that prevent the degradation of the high-frequency performance caused by the increase in capacitance, prevent the breakdown between the drain electrodes and the rear electrode, and allow holes generated by impact ionization to be easily and reliably extracted and discharged without increasing the chip area. Thus, a highly reliable high power supply device is achieved.

Fourth Embodiment

The present embodiment will disclose a high-frequency amplifier including any one of the HEMTs disclosed in the first and second embodiments and their modifications.

Figure 21:
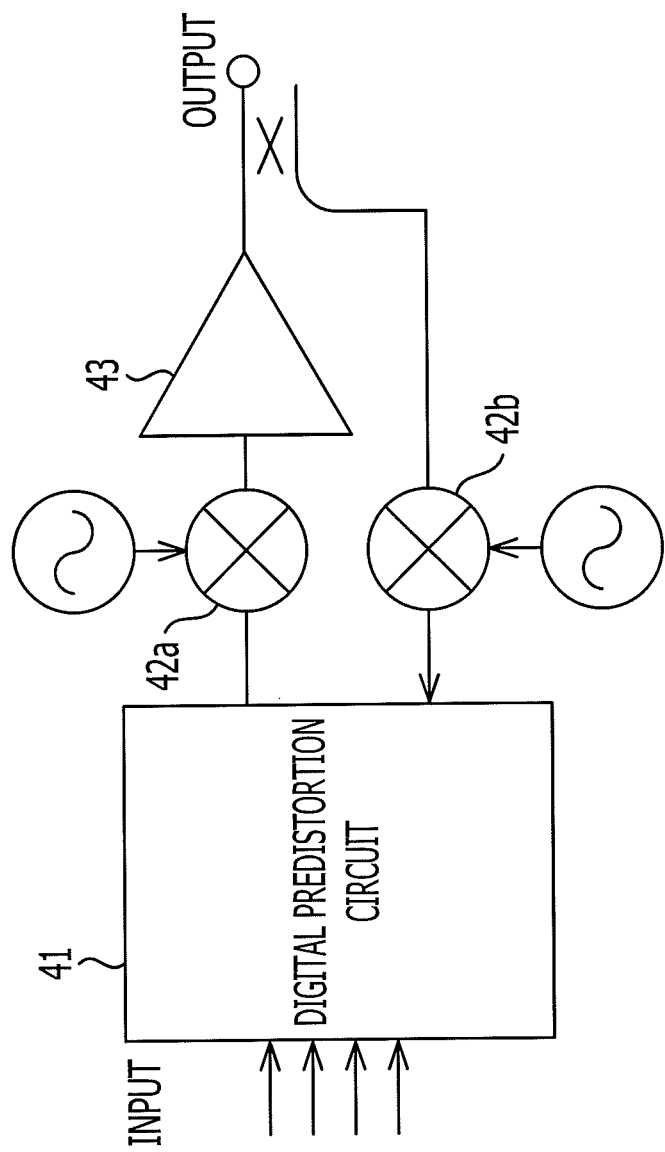
FIG. 21 is a schematic connection diagram of a high-frequency amplifier according to a fourth embodiment.

FIG. 21 is a schematic connection diagram of a high-frequency amplifier according to a fourth embodiment.

The high-frequency amplifier of the present embodiment is used as, for example, a base station power amplifier of a cellular phone. This high-frequency amplifier includes a digital predistortion circuit 41, mixers 42a and 42b, and a power amplifier 43.

The digital predistortion circuit 41 is intended to compensate for non-linear distortion of input signals. The mixer 42a mixes an input signal whose non-linear distortion has been compensated and an AC signal. The power amplifier 43 amplifies the input signal mixed with the AC signal, and includes an HEMT of any one of the first and second embodiments and their modifications. In the configuration illustrated in FIG. 21, the output signal is mixed with an AC signal in the mixer 42b and then transmitted to the digital predistortion circuit 41.

In the present embodiment, the high-frequency amplifier includes the HEMT that prevents the degradation of the high-frequency performance caused by the increase in capacitance, prevents the breakdown between the drain electrodes and the rear electrode, and allows holes generated by impact ionization to be easily and reliably extracted and discharged without increasing the chip area. Thus, a highly reliable high-frequency amplifier having a high withstand voltage is achieved.

All examples and conditional language recited herein are intended for pedagogical purposes to aid the reader in understanding the invention and the concepts contributed by the inventor to furthering the art, and are to be construed as being without limitation to such specifically recited examples and conditions.

Although the embodiments in accordance with aspects of the present invention have been described in detail, it should be understood that various changes, substitutions, and alterations could be made hereto without departing from the spirit and scope of the invention.

I claim:

1. A compound semiconductor device, comprising:
    a substrate;
    a compound semiconductor layer disposed over the surface of the substrate;
    a source electrode, a drain electrode and a gate electrode formed over the compound semiconductor layer;
    an opening penetrates the substrate and formed in the compound semiconductor layer under a position with the source electrode;
    a local p-type region partially formed in the compound semiconductor layer under the position with the source electrode, which is exposed at a bottom of the opening; and
    a rear electrode made of a conductive material, the rear electrode being disposed in the opening so as to be connected to the local p-type region,
    wherein the local p-type region is in a distant position with the source electrode.

2. The compound semiconductor device according to claim 1, wherein the substrate is one of insulating and semi-insulating, and wherein the rear electrode covers inner wall and the bottom of the opening.

3. The compound semiconductor device according to claim 1, wherein the opening lies under the source electrode so as to be aligned with the source electrode.

4. The compound semiconductor device according to claim 1, further comprising a source line formed over the compound semiconductor layer, wherein the opening lies under the source line so as to be aligned with the source line.

5. The compound semiconductor device according to claim 1, further comprising a source line and a gate line formed over the compound semiconductor layer, wherein the opening lies under a region where the source line and the gate line are disposed, so as to be aligned with the region.

6. A power supply device, comprising:
a high-voltage circuit including a transistor;
a low-voltage circuit; and
a transformer between the high-voltage circuit and the low-voltage circuit,
wherein the transistor includes
a substrate,
a compound semiconductor layer disposed over the surface of the substrate,
a source electrode, a drain electrode and a gate electrode formed over the compound semiconductor layer,
an opening penetrates the substrate and formed in the compound semiconductor layer under a position with the source electrode,
a local p-type region partially formed in the compound semiconductor layer under the position with the source electrode, which is exposed at a bottom of the opening, and
a rear electrode made of a conductive material, the rear electrode being disposed in the opening so as to be connected to the local p-type region,
wherein the local p-type region is in a distant position with the source electrode.

7. A high-frequency amplifier that amplifies a high-frequency input voltage, the high-frequency amplifier, comprising:
a power amplifier configured to amplifies a mixed signal of a compensated input signal and a AC signal, the power amplifier includes a transistor,
wherein the transistor including
a substrate,
a compound semiconductor layer disposed over the surface of the substrate,
a source electrode, a drain electrode and a gate electrode formed over the compound semiconductor layer,
an opening penetrates the substrate and formed in the compound semiconductor layer under a position with the source electrode is formed,
a local p-type region partially formed in the compound semiconductor layer under the position with the source electrode, which is exposed at a bottom of the opening, and
a rear electrode made of a conductive material, the rear electrode being disposed in the opening so as to be connected to the local p-type region,
wherein the local p-type region is in a distant position with the source electrode.

* * * * *